United States Patent
Wang et al.

(10) Patent No.: US 10,535,726 B2
(45) Date of Patent: Jan. 14, 2020

(54) ORGANIC LIGHT-EMITTING DIODE DISPLAY PANEL, METHOD FOR FABRICATING THE SAME, AND DISPLAY DEVICE

(71) Applicant: BOE TECHNOLOGY GROUP CO., LTD., Beijing (CN)

(72) Inventors: Lei Wang, Beijing (CN); Minghua Xuan, Beijing (CN); Shengji Yang, Beijing (CN); Pengcheng Lu, Beijing (CN); Li Xiao, Beijing (CN); Jie Fu, Beijing (CN); Xiaochuan Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/773,057

(22) PCT Filed: Nov. 16, 2017

(86) PCT No.: PCT/CN2017/111316
§ 371 (c)(1),
(2) Date: May 2, 2018

(87) PCT Pub. No.: WO2018/201692
PCT Pub. Date: Nov. 8, 2018

(65) Prior Publication Data
US 2019/0140043 A1    May 9, 2019

(30) Foreign Application Priority Data

May 4, 2017 (CN) .......................... 2017 1 0309230

(51) Int. Cl.
*H01L 27/32*    (2006.01)
*H01L 51/52*    (2006.01)

(52) U.S. Cl.
CPC ...... *H01L 27/3279* (2013.01); *H01L 51/5209* (2013.01); *H01L 2227/323* (2013.01)

(58) Field of Classification Search
CPC ............. H01L 27/3279; H01L 51/5209; H01L 2227/323
See application file for complete search history.

(56) References Cited

U.S. PATENT DOCUMENTS

2014/0103313 A1\* 4/2014 Ma .......................... H01L 51/52
257/40
2016/0124557 A1 5/2016 Choi

FOREIGN PATENT DOCUMENTS

CN     102916030    2/2013
CN     103646950    3/2014
(Continued)

OTHER PUBLICATIONS

International Searching Authority, "International Search Report and Written Opinion," International Patent Application No. PCT/CN2017/111316, dated Feb. 13, 2018, 9 pages.

*Primary Examiner* — Kyoung Lee
(74) *Attorney, Agent, or Firm* — Arent Fox LLP; Michael Fainberg

(57) ABSTRACT

There are disclosed an organic light-emitting diode display panel, a method for fabricating the same, and a display device above, and the organic light-emitting diode display panel includes: an underlying substrate, a plurality of pixel elements arranged on the underlying substrate, pixel driving circuits electrically coupled to respective pixel elements, and a plurality of signal lines electrically coupled to the pixel driving circuits; and the organic light-emitting diode display panel further includes a resistance reducing electrode arranged at a different layer from, and connected in parallel with at least one signal line. Since the resistance reducing electrode is connected in parallel with the signal lines, (Continued)

resistances of the respective signal lines can be reduced to thereby lower a signal load on the respective signal lines so as to improve the display quality of the organic light-emitting diode display panel.

15 Claims, 6 Drawing Sheets

(56) References Cited

FOREIGN PATENT DOCUMENTS

| | | |
|---|---|---|
| CN | 103872078 | 6/2014 |
| CN | 103943649 | 7/2014 |
| CN | 104091818 | 10/2014 |
| CN | 106910765 | 6/2017 |

* cited by examiner

ORGANIC LIGHT-EMITTING DIODE DISPLAY PANEL, METHOD FOR FABRICATING THE SAME, AND DISPLAY DEVICE

This application is a US National Stage of International Application No. PCT/CN2017/111316, filed on Nov. 16, 2017, designating the United States and claiming priority to priority to Chinese Patent Application No. 201710309230.X, filed with the Chinese Patent Office on May 4, 2017, and entitled "An organic light-emitting diode display panel, a method for fabricating the same, and a display device", the content of which is hereby incorporated by reference in its entirety.

FIELD

The present disclosure relates to the field of display technologies, and particularly to an organic light-emitting diode display panel, a method for fabricating the same, and a display device.

BACKGROUND

With the constant development of display panels, users require a higher and higher Pixels Per Inch (PPI) of the display panels. As the Virtual Reality (VR) technologies and the Augmented Reality (AR) technologies are emerging gradually, there is a higher PPI requirement for near-eye displaying thereof.

An Organic Light-Emitting Diode (OLED) display panel is expected to be predominant among future display panels due to its advantages of self-luminescence, no backlight source required, a high contrast, a small thickness, a wide angle of view, a high response speed, applicability to a flexible panel, a wide range of operating temperatures, a simple structure, a simple fabrication process, and other excellent characteristics.

The organic light-emitting diode display panel generally includes an underlying substrate, pixel driving circuits arranged on the underlying substrate, anodes arranged above the pixel driving circuits, hole injection layers arranged above the anodes, hole transport layers arranged above the hole injection layers, light-emitting layers arranged above the hole transport layers, electron transport layers arranged above the light-emitting layers, electron injection layers arranged above the electron transport layers, cathodes arranged above the electron injection layers, and encapsulation layers arranged above the cathodes. Generally a stack of the hole injection layer, the hole transport layer, the light-emitting layer, the electron transport layer, and the electron injection layer is referred to as an organic light-emitting material layer, and the anode, the organic light-emitting material layer and the cathode contact with each other. As can be apparent from the description above, the organic light-emitting diode display panel shall be driven by the pixel driving circuits to display an image. It is difficult to provide the organic light-emitting diode display panel with a high PPI as compared with a Liquid Crystal Display (LCD) panel in which each pixel is driven using only a Thin Film Transistor (TFT).

In a real design of the pixel driving circuit, a space thereof shall be extremely compressed, so longitudinally routed direct-current high-level signal lines (VDD) which are typically arranged at the same layer as data lines shall be modified to transversely routed direct-current high-level signal lines (VDD) arranged at the same layer as gate lines. For a process of the organic light-emitting diode display panel, the resistivity of molybdenum metal of the transverse direct-current high-level signal lines is far higher than the resistivity of aluminum metal of the longitudinal direct-current high-level signal lines, so a signal load on the transversely routed direct-current high-level signal lines is greatly increased. There is a signal delay due to a high load, thus greatly degrading the display quality of the organic light-emitting diode display panel.

SUMMARY

In view of this, embodiments of the present disclosure provide an organic light-emitting diode display panel, a method for fabricating the same, and a display device.

An embodiment of the present disclosure provides an organic light-emitting diode display panel including an underlying substrate, a plurality of pixel elements arranged on the underlying substrate, pixel driving circuits electrically coupled to respective pixel elements, and a plurality of signal lines electrically coupled to the pixel driving circuits, wherein the organic light-emitting diode display panel further includes: a resistance reducing electrode arranged at a different layer from, and connected in parallel with at least one of the signal lines.

Optionally in the organic light-emitting diode display panel above according to the embodiment of the present disclosure, the signal line extends in a first direction, and the signal line is configured to transmit a voltage-constant signal.

Optionally in the organic light-emitting diode display panel above according to the embodiment of the present disclosure, the resistance reducing electrode extends in a first direction, or the resistance reducing electrode extends in a second direction, wherein there is an angle between the first direction and the second direction.

Optionally in the organic light-emitting diode display panel above according to the embodiment of the present disclosure, the resistance reducing electrode is structured like a grid.

Optionally in the organic light-emitting diode display panel above according to the embodiment of the present disclosure, the resistance reducing electrode is electrically coupled to respective signal lines through a plurality of via holes.

Optionally in the organic light-emitting diode display panel above according to the embodiment of the present disclosure, there is an overlapping area between a positive projection of the resistance reducing electrode onto the underlying substrate and a positive projection of a pixel definition layer onto the underlying substrate.

Optionally in the organic light-emitting diode display panel above according to the embodiment of the present disclosure, the positive projection of the resistance reducing electrode onto the underlying substrate does not overlap with positive projections of gaps between respective pixel elements onto the underlying substrate.

Optionally in the organic light-emitting diode display panel above according to the embodiment of the present disclosure, each pixel element includes a first electrode, a second electrode, and a light-emitting layer located between the first electrode and the second electrode; and the resistance reducing electrode is arranged at the same layer as the first electrode, or the resistance reducing electrode is arranged at the same layer as the second electrode.

Optionally in the organic light-emitting diode display panel above according to the embodiment of the present disclosure, the resistance reducing electrode is arranged at a different layer from the pixel elements.

Optionally in the organic light-emitting diode display panel above according to the embodiment of the present disclosure, the organic light-emitting diode display panel further includes an insulation layer arranged between the resistance reducing electrode and the pixel elements.

Optionally in the organic light-emitting diode display panel above according to the embodiment of the present disclosure, the resistance reducing electrode is located between the pixel elements and the pixel driving circuits.

An embodiment of the present disclosure provides a display device including the organic light-emitting diode display panel above.

An embodiment of the present disclosure provides a method for fabricating the organic light-emitting diode display panel above, the method including: providing an underlying substrate; forming pixel driving circuits on the underlying substrate, and a plurality of signal lines coupled to the pixel driving circuits; and forming a resistance reducing electrode arranged at a different layer from the signal lines, wherein the resistance reducing electrode is coupled to the signal lines.

Optionally in the fabricating method above according to the embodiment of the present disclosure, forming the resistance reducing electrode arranged at a different layer from the signal lines includes: forming a first electrode layer arranged at a different layer from the signal lines; and forming first electrodes and the resistance reducing electrode at the first electrode layer in a patterning process.

DETAILED DESCRIPTION OF THE EMBODIMENTS

Figure 1:
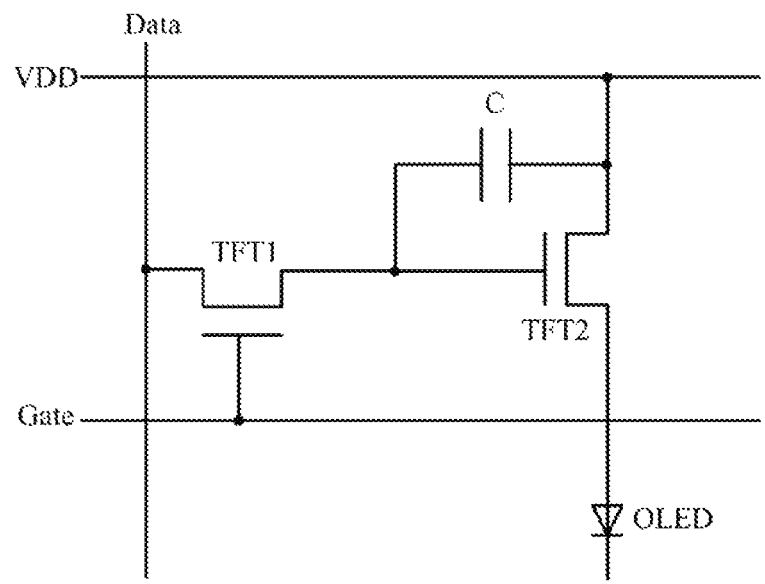
FIG. 1 is a schematic structural diagram of a 2T1C pixel circuit in the prior art.

In order to improve the PPI of the organic light-emitting diode display panel, FIG. 1 illustrates a 2T1C pixel driving circuit including two TFT1 and TFT2 capable of switching, and one capacitor (C) in which charges are stored, for driving the organic light-emitting diode display panel. When the TFT1 is provided with a switching-on signal on a gate line Gate, the TFT1 is switched on, and thereafter the TFT1 selectively provides the gate of the TFT2 with a data voltage signal on a data line Data, and the data voltage signal is stored in the capacitor C. Thereafter the TFT2 converts the stored data voltage signal into a current signal flowing through the TFT2, and since the TFT2 is connected in series with an OLED, the current signal flowing through the TFT2 is a current signal of the OLED while operating.

However in a real design of the pixel driving circuit, the utilization ratio of the space shall be improved as many as possible, so a longitudinally routed direct-current high-level signal line (VDD) which is typically arranged at the same layer as the data line Data shall be modified to a transversely routed direct-current high-level signal line (VDD) arranged at the same layer as the gate line Gate as illustrated in FIG. 1. For a process of the organic light-emitting diode display panel, the resistivity of molybdenum metal of the transverse direct-current high-level signal line is far higher than the resistivity of aluminum metal of the longitudinal direct-current high-level signal line, so a signal load on the transversely routed direct-current high-level signal line is greatly increased.

The inventors have identified from a simulation test that the 2T1C pixel driving circuit with the transverse direct-current high-level signal line is only applicable to an organic light-emitting diode display panel with a size of approximately one inch, but for a VR or AR-enabled organic light-emitting diode display panel with a size of more than 3.5 inches, there is a signal delay due to a high load, thus greatly degrading the display quality of the organic light-emitting diode display panel.

Furthermore with the development of the display technologies, organic light-emitting diode display panels being developed have an increasing size, and a higher and higher resolution and refresh rate. There is an increasing signal load on signal lines, such as gate lines and data lines, coupled to pixel driving circuits due to the increasing size, and the higher and higher resolution and refresh rate of the display panels, thus seriously degrading the display quality of the organic light-emitting diode display panels.

In view of this, embodiments of the present disclosure provide an organic light-emitting diode display panel, a method for fabricating the same, and a display device. In order to make the objects, technical solutions, and advantages of the present disclosure more apparent, the present disclosure will be described below in further details with the drawings, and apparently the embodiments as described are merely a part but not all of the embodiments of the present disclosure. Based upon the embodiments here of the present disclosure, all the other embodiments which can occur to those ordinarily skilled in the art from the embodiments here of the disclosure without any inventive effort shall fall into the scope of the present disclosure as claimed.

Figure 3:
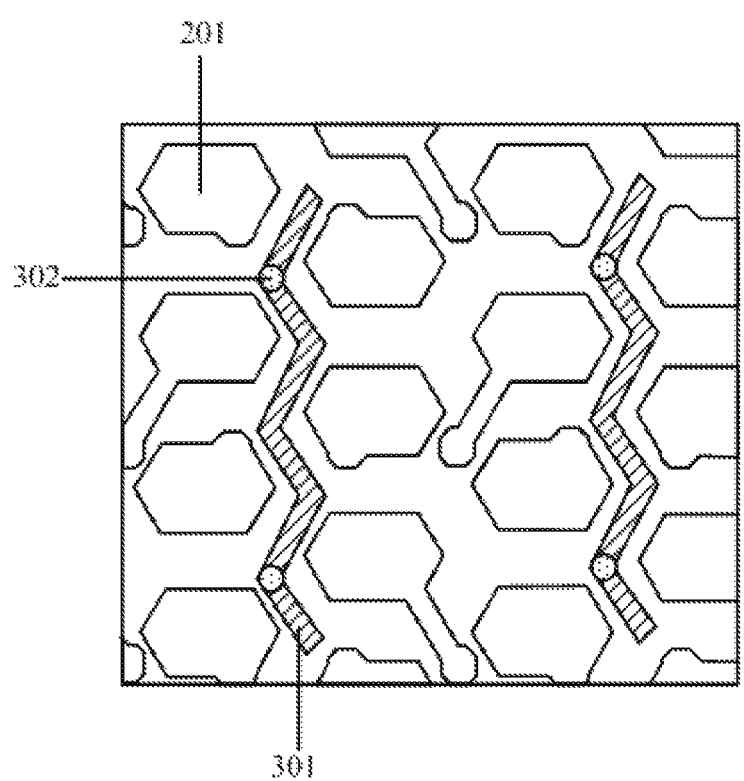
FIG. 3 is a first schematic structural diagram of a resistance reducing electrode in the organic light-emitting diode display panel according to the embodiment of the present disclosure.
Figure 4:
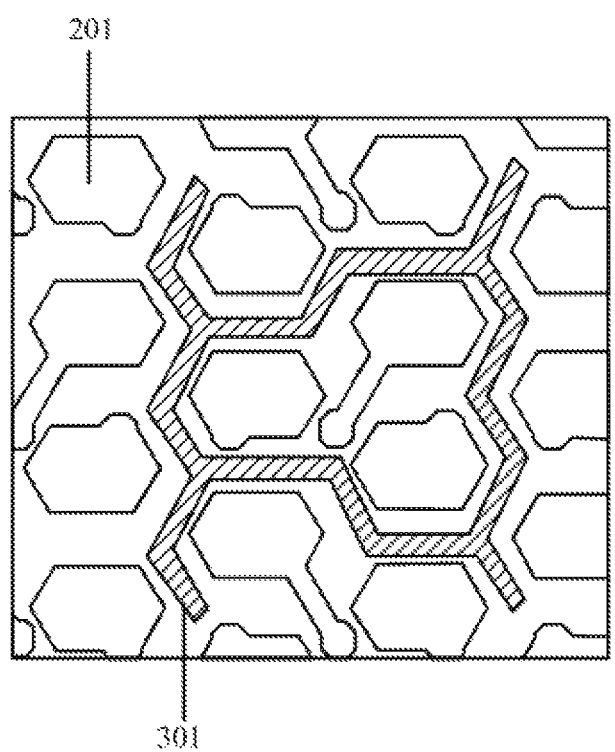
FIG. 4 is a second schematic structural diagram of the resistance reducing electrode in the organic light-emitting diode display panel according to the embodiment of the present disclosure.

An embodiment of the present disclosure provides an organic light-emitting diode display panel including: an underlying substrate, a plurality of pixel elements arranged on the underlying substrate, pixel driving circuits electrically coupled to the respective pixel elements, and a plurality of signal lines electrically coupled to the pixel driving circuits; and as illustrated in FIG. 3 and FIG. 4, the organic light-emitting diode display panel further includes the following.

A resistance reducing electrode 301 arranged at a different layer from, and connected in parallel with at least one signal line (not illustrated).

In the organic light-emitting diode display panel above according to the embodiment of the present disclosure, the resistance reducing electrode 301 is arranged at a different layer from, and electrically coupled to the signal lines, that is, the resistance reducing electrode is connected in parallel with the respectively signal lines, so resistances of the respective signal lines can be reduced to thereby lower a signal load on the respective signal lines so as to improve the display quality of the organic light-emitting diode display panel.

Optionally in order to lower a signal load on the respective signal lines as many as possible, in the organic light-emitting diode display panel above according to the embodiment of the present disclosure, there is arranged a resistance reducing electrode connected in parallel with the respective signal lines.

Optionally in the organic light-emitting diode display panel above according to the embodiment of the present disclosure, the signal line extends in a first direction, and the signal line is configured to transmit a voltage-constant signal. The first direction is typically a direction parallel to the shorter side of the display panel.

Particularly the respective signal lines can be transverse direct-current high-level signal lines, that is, there can be arranged a resistance reducing electrode arranged at a different layer from, and electrically coupled to the respective transverse direct-current high-level signal lines to thereby reduce resistances of the respective transverse direct-current high-level signal lines so as to achieve an effect of improving the uniformity of a displayed image as whole and the quality of the displayed image.

It shall be noted that in the organic light-emitting diode display panel above according to the embodiment of the present disclosure, not only the resistance reducing electrode can be arranged to thereby reduce the resistances of the transverse direct-current high-level signal lines, but also a resistance reducing electrode can be arranged to thereby reduce resistances of other signal lines, e.g., gate lines, data lines, common electrode lines, clock signal lines, or touch signal lines, so as to improve the display quality of the organic light-emitting diode display panel.

For the sake of convenient understanding of the technical solution according to the embodiment of the present disclosure, the signal lines are transverse direct-current high-level signal lines throughout the following description by way of an example.

Optionally in the organic light-emitting diode display panel above according to the embodiment of the present disclosure, the pixel driving circuits are typically located between the underlying substrate and the pixel elements, and the pixel driving circuits can be pixel driving circuits in any structure for driving the pixel elements to emit light, e.g., 2T1C pixel driving circuits as illustrated in FIG. 1. Of course, the pixel driving circuits can alternatively be pixel driving circuits in another structure with an internal compensation function or an external compensation function, although the embodiment of the present disclosure will not be limited thereto.

Figure 7:
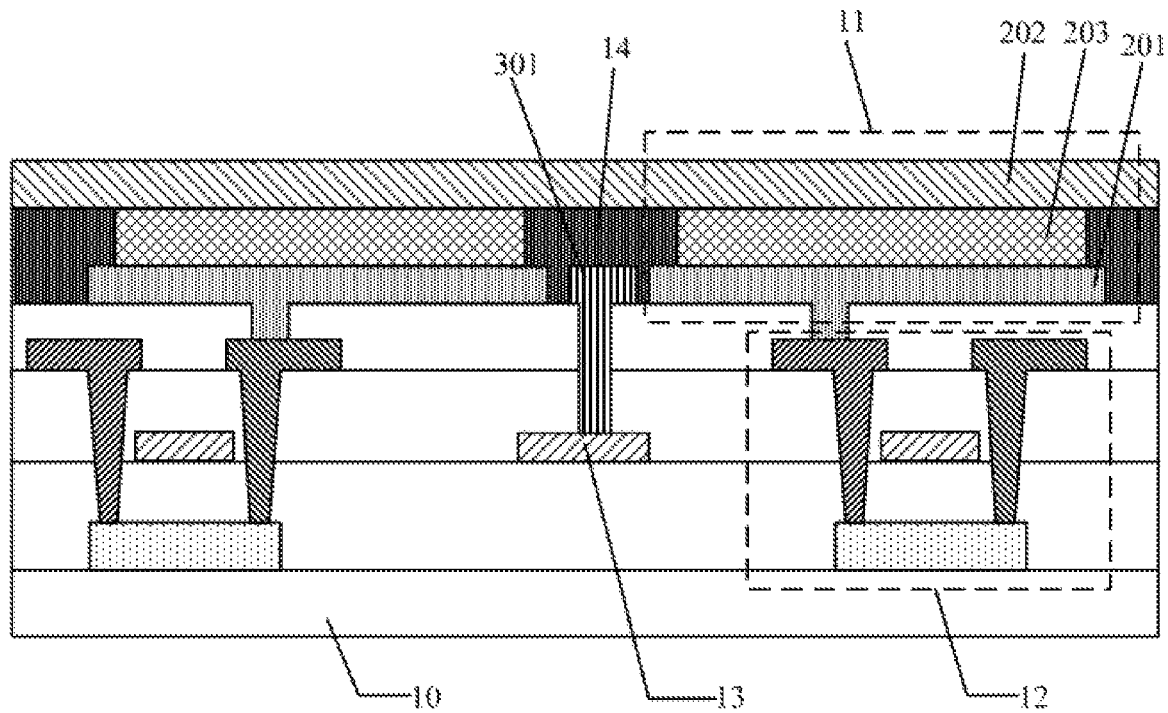
FIG. 7 is a schematic structural diagram of the organic light-emitting diode display panel in a sectional view.

Optionally in the organic light-emitting diode display panel above according to the embodiment of the present disclosure, as illustrated in FIG. 7, a pixel element 11 generally includes a first electrode, a second electrode, and a light-emitting layer 203 located between the first electrode and the second electrode. One of the first electrode and the second electrode is an anode 201, and the other electrode is a cathode 202. A pixel driving circuit 12 is coupled to the anode 201, and the cathode 202 is typically a common electrode layer. The respective signal lines 13 are typically arranged between the pixel elements 11 and the underlying substrate 10.

Optionally in the organic light-emitting diode display panel above according to the embodiment of the present disclosure, the underlying substrate can be a flexible underlying substrate, e.g., a heat-resistant and perdurable plastic substrate made of a material of polyvinylether phthalate, polyethylene naphthalate, polycarbonate, polyaryl compounds, polyetherimide, polyethersulfone, or polyimide; or can be a rigid underlying substrate, e.g., glass substrate, although the embodiment of the present disclosure will not be limited thereto.

Figure 5:
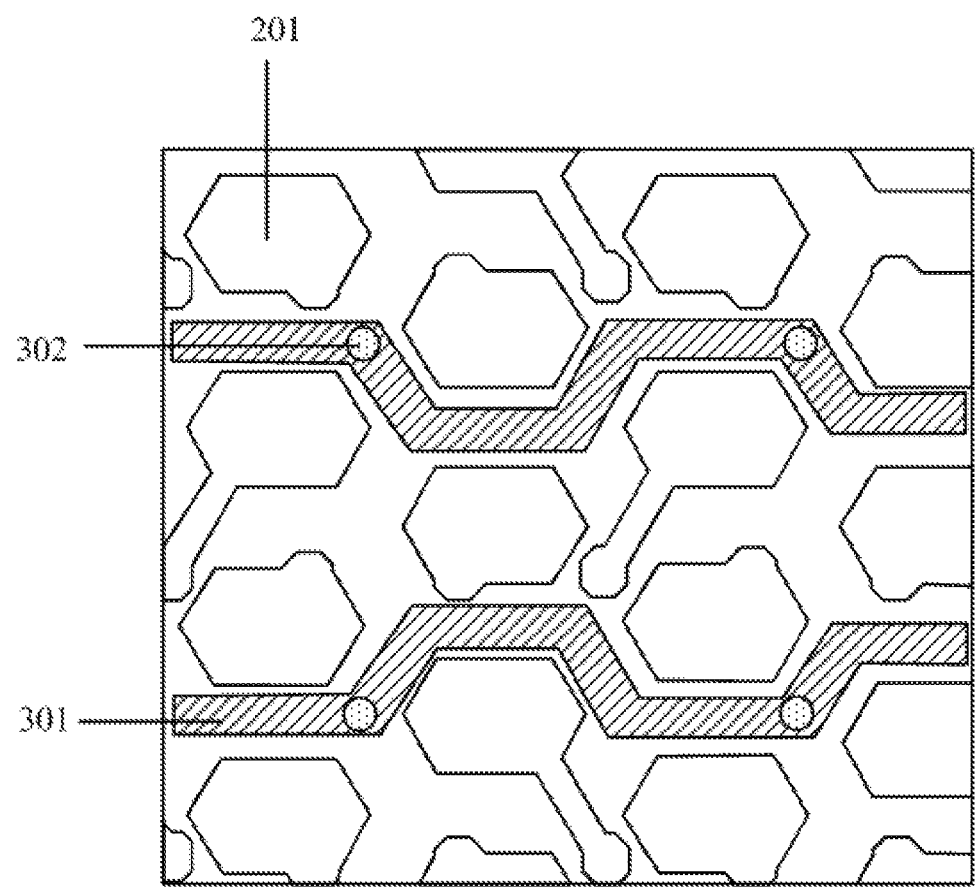
FIG. 5 is a third schematic structural diagram of the resistance reducing electrode in the organic light-emitting diode display panel according to the embodiment of the present disclosure.

Optionally in the organic light-emitting diode display panel above according to the embodiment of the present disclosure, the resistance reducing electrode 301 can be embodied in a number of implementations. For example, the resistance reducing electrode 301 extends in the first direction as illustrated in FIG. 5, or the resistance reducing electrode 301 extends in a second direction as illustrated in FIG. 3, where there is an angle between the first direction and the second direction. FIG. 5 illustrates the first direction which is the row direction, and FIG. 3 illustrates the second direction which is the column direction, although the embodiment of the present disclosure will not be limited thereto.

Alternatively the resistance reducing electrode 301 is structured like a grid as illustrated in FIG. 4, although the embodiment of the present disclosure will not be limited thereto. Furthermore there is a lower resistance of the resistance reducing electrode 301 structured like a grid than the resistance reducing electrode 301 consisted of wires extending in separate directions, so that the resistances of the transverse direct-current high-level signal lines can be further reduced to thereby improve the display quality of the organic light-emitting diode display panel. FIG. 3 to FIG. 5 only illustrate the relative positional relationship between the anodes 201 and the resistance reducing electrode(s) 301.

Optionally in the organic light-emitting diode display panel above according to the embodiment of the present disclosure, the resistance reducing electrode 301 is structured like a grid.

Figure 6:
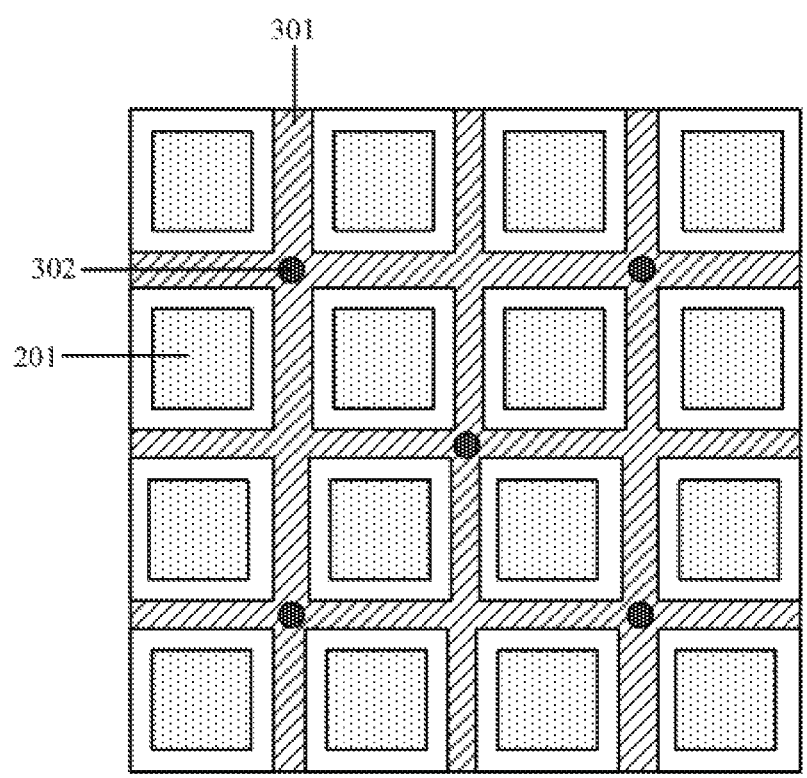
FIG. 6 is a fourth schematic structural diagram of the resistance reducing electrode in the organic light-emitting diode display panel according to the embodiment of the present disclosure.

It shall be noted that in the organic light-emitting diode display panel above according to the embodiment of the present disclosure, the pixel elements will not be limited to any particular arrangement and shape, although the shape of the anodes 201 in the pixel elements is designed to match the arrangement of the gate lines routed on the underlying substrate in FIG. 2 to FIG. 5. Accordingly it can be appreciated that the shape of the anodes 201 can alternatively be a rectangle in FIG. 6.

It shall be noted that in the organic light-emitting diode display panel above according to the embodiment of the present disclosure, there may be a number of shapes of the resistance reducing electrode, e.g., a straight line, a polyline, or a wave line, and their shape can be set particularly as needed in reality and under a process condition, although the embodiment of the present disclosure will not be limited thereto.

Furthermore in order to provide the resistance reducing electrode with a lower resistance, the resistance reducing electrode can be made of a metal material. Optionally the material of the resistance reducing electrode can be one or an alloy of magnesium, aluminum, copper, and silver with a lower resistivity, although the embodiment of the present disclosure will not be limited thereto.

Optionally in the organic light-emitting diode display panel above according to the embodiment of the present disclosure, the resistance reducing electrode 301 can be electrically coupled to the transverse direct-current high-level signal lines through a plurality of via holes 302 as illustrated in FIG. 3. With this arrangement, the transverse direct-current high-level signal lines are equivalently connected in parallel with a plurality of metal resistors constituting the resistance reducing electrode 301, so that the resistances of the transverse direct-current high-level signal lines can be reduced as many as possible to thereby greatly lower a signal load on the transverse direct-current high-level signal lines so as to significantly improve the display quality of the organic light-emitting diode display panel.

Optionally in order not to hinder the anodes 201 from providing the light-emitting layers with holes, in the organic light-emitting diode display panel above according to the embodiment of the present disclosure, as illustrated in FIG. 7, a positive projection of the resistance reducing electrode 301 onto the underlying substrate 10 is located within positive projections of gaps between the respective pixel elements 11 onto the underlying substrate 10, that is, there is an overlapping area between the positive projection of the resistance reducing electrode 301 onto the underlying substrate 10 and a positive projection of a pixel definition layer 14 onto the underlying substrate 10.

Optionally in order to increase the line width of the resistance reducing electrode 301 as many as possible, and to lower the resistance of the resistance reducing electrode 301 so as to greatly lower the resistances of the transverse direct-current high-level signal lines, in the organic light-emitting diode display panel above according to the embodiment of the present disclosure, the positive projection of the resistance reducing electrode 301 onto the underlying substrate completely overlaps with the positive projection of pixel definition layer 14 onto the underlying substrate.

Furthermore in order not to hinder the pixel elements from emitting light, in the organic light-emitting diode display panel above according to the embodiment of the present disclosure, the positive projection of the resistance reducing electrode 301 onto the underlying substrate does not overlap with the positive projections of gaps between the respective pixel elements onto the underlying substrate 10, that is, there is not any overlapping area between the positive projection of the resistance reducing electrode 301 onto the underlying substrate and positive projections of the light-emitting layers of the respective pixel elements onto the underlying substrate.

Optionally in the organic light-emitting diode display panel above according to the embodiment of the present disclosure, the resistance reducing electrode is arranged at the same layer as the first electrodes, so that the resistance reducing electrode can be formed in the same patterning process as the first electrodes; or the resistance reducing electrode is arranged at the same layer as the second electrodes, so that the resistance reducing electrode can be formed in the same patterning process as the second electrodes.

Figure 2:
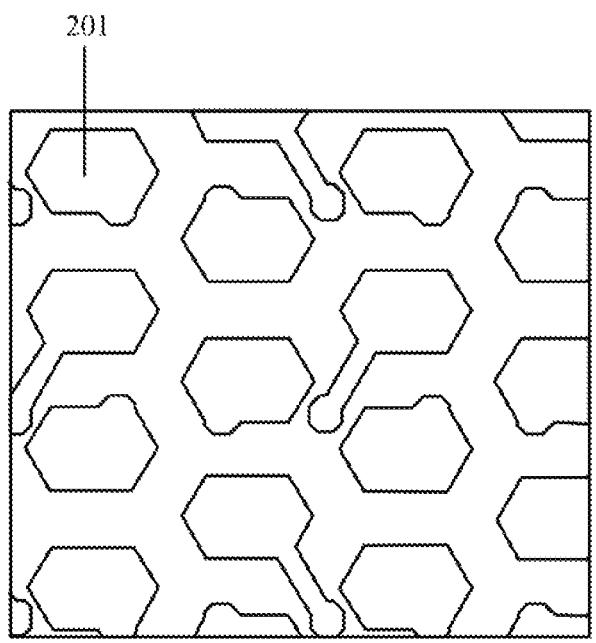
FIG. 2 is a schematic diagram of arranged anodes of respective pixel elements in an organic light-emitting diode display panel according to an embodiment of the present disclosure.

In view of a demand for a process of fabricating the organic light-emitting diode display panel, in order to prevent color crosstalk between pixel elements in different colors, there is a large safeguard distance between the anodes 201 of the respective elements as illustrated in FIG. 2. Hereupon optionally in the organic light-emitting diode display panel above according to the embodiment of the present disclosure, the resistance reducing electrode 301 can be arranged at the same layer as the anodes 201 as illustrated in FIG. 7, that is, the resistance reducing electrode 301 is arranged within the safeguard distance, and insulated from the anodes 201. As such, on one hand, the resistance reducing electrode 301 is arranged within the safeguard distance, so that there is not any overlapping area between the positive projection of the resistance reducing electrode 301 onto the underlying substrate and the positive projections of light-emitting areas of the respective pixel elements onto the underlying substrate, so as not to affect a normal display function; and on the other hand, the resistance reducing electrode 301 is arranged at the same layer as the anodes 201 to thereby avoid a new layer structure from being introduced, so as to facilitate a design of the organic light-emitting diode display panel being lightweight and thinned.

Furthermore as illustrated in FIG. 7, when the resistance reducing electrode 301 is arranged at the same layer as the anodes 201, in the organic light-emitting diode display panel above according to the embodiment of the present disclosure, the resistance reducing electrode 301 can be fabricated at the same time as the anodes 201, that is, a pattern of the resistance reducing electrode 301 can be formed at the same time as patterns of the anodes 201 in a patterning process. In this way, the layer of the anodes 201 is modified in structure in such a way that the resistance reducing electrode 301 is formed at original gaps between the respective anodes 201, that is within a safe distance, so that the organic light-emitting diode display panel can be fabricated based on the prior art without any additional process to thereby save the production cost, and improve the production efficiency.

Of course, optionally in the organic light-emitting diode display panel above according to the embodiment of the present disclosure, the resistance reducing electrode 301 can alternatively be arranged at a different layer from the pixel elements, that is, a pattern of the resistance reducing electrode 301 can be fabricated in a separate patterning process.

Furthermore when the resistance reducing electrode 301 is arranged at a different layer from the pixel elements, in order to avoid mutual interference between the resistance reducing electrode 301 and the anodes 201, in the organic light-emitting diode display panel above according to the embodiment of the present disclosure, the organic light-emitting diode display panel can further include an insulation layer between the resistance reducing electrode 301 and the anodes 201. Furthermore the insulation layer can be structured in one or more layers, although the embodiment of the present disclosure will not be limited thereto.

Optionally when the resistance reducing electrode 301 is arranged at a different layer from the pixel elements, in the organic light-emitting diode display panel above according to the embodiment of the present disclosure, the resistance reducing electrode 301 is located between the pixel elements and the pixel driving circuits. Generally there is a planarization layer arranged between the anodes 201 and the pixel driving circuits, and hereupon the resistance reducing electrode 301 can particularly be arranged between the pixel driving circuits and the planarization layer. With this arrangement, the existing planarization layer can be used as the insulation layer between the resistance reducing electrode 301 and the anodes 201, so that only a process of fabricating the resistance reducing electrode 301 is added to the process of fabricating the organic light-emitting diode display panel without any additional process of fabricating the resistance reducing electrode 301 and the insulation layer, so as to simplify the fabrication process to some extent, and to lower the fabrication cost.

Furthermore a material of the planarization layer can be an organic insulating material of polyacrylic resin, polyepoxide resin, photosensitive polyimide resin, polyester acrylate, urethane acrylate resin, or phenolic epoxy acrylic resin, although the embodiment of the present disclosure will not be limited thereto.

Optionally when the resistance reducing electrode 301 is a film layer located between the anodes 201 and the pixel driving circuits, the resistance reducing electrode 301 may not hinder the anodes 201 from providing the light-emitting layers with holes, so there may be not only an overlapping area between the positive projection of the resistance reducing electrode 301 onto the underlying substrate and the positive projection of the pixel definition layer onto the underlying substrate, but also an overlapping area between the positive projection of the resistance reducing electrode 301 onto the underlying substrate and the positive projections of the respective pixel elements onto the underlying substrate.

Furthermore there are typically also the light-emitting layers and the cathodes on the anodes 201 of the pixel elements, and hereupon when the resistance reducing electrode 301 is arranged at a different layer from the anodes 201, in the organic light-emitting diode display panel above according to the embodiment of the present disclosure, alternatively the resistance reducing electrode 301 can be arranged at a film layer between the anodes 201 and the light-emitting layers, or the resistance reducing electrode 301 can be arranged at a film layer between the light-emitting layers and the cathodes, although the embodiment of the present disclosure will not be limited thereto.

Furthermore in the organic light-emitting diode display panel above according to the embodiment of the present disclosure, in order not to hinder the anodes 201 from providing the light-emitting layers with holes, when the resistance reducing electrode 301 is arranged between the anodes 201 and the light-emitting layers, or the resistance reducing electrode 301 is arranged between the light-emitting layers and the cathodes, the positive projection of the resistance reducing electrode 301 onto the underlying substrate shall not overlap with the positive projections of the respective pixel elements onto the underlying substrate.

It shall be noted that the organic light-emitting diode display panel above according to the embodiment of the present disclosure is a top-emitting organic light-emitting diode display panel, so the anodes are made of a light-transmitting material, so that light emitted from the light-emitting layers exit the cathodes. However it shall be noted that the resistance reducing electrode 301 according to the embodiment of the present disclosure can also be applicable to a bottom-emitting organic light-emitting diode display panel, although the embodiment of the present disclosure will not be limited thereto.

Based upon the same inventive idea, an embodiment of the present disclosure provides a method for fabricating the organic light-emitting diode display panel above, and since the fabricating method addresses the problem under a similar principle to the organic light-emitting diode display panel above, reference can be made to the implementation of the organic light-emitting diode display panel above according to the embodiment of the present disclosure for an implementation of the fabricating method, and a repeated description thereof will be omitted here.

Figure 8:
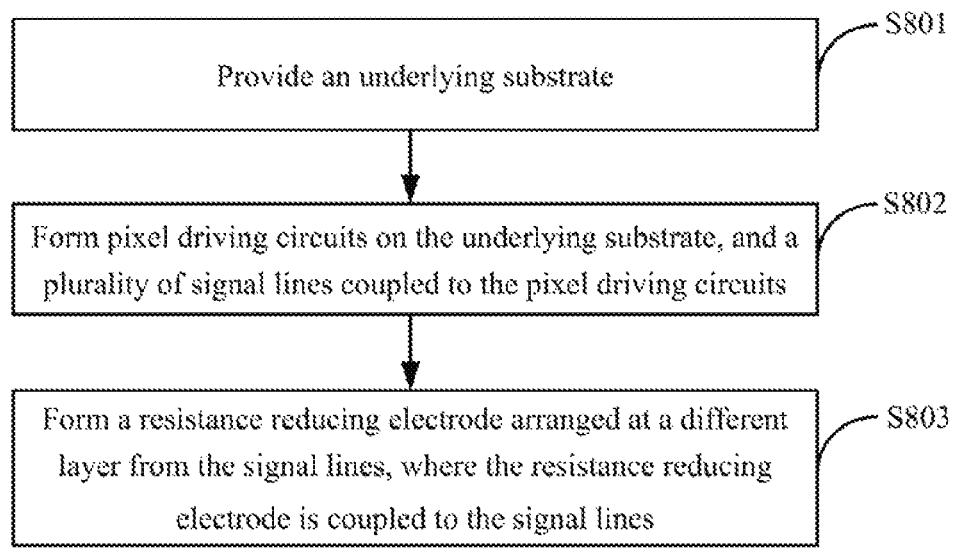
FIG. 8 is a flow chart of a method for fabricating an organic light-emitting diode display panel according to an embodiment of the present disclosure.

As illustrated in FIG. 8, an embodiment of the present disclosure provides a method for fabricating the organic light-emitting diode display panel above, which can particularly include the following steps.

S801 is to provide an underlying substrate.

S802 is to form pixel driving circuits on the underlying substrate, and a plurality of signal lines coupled to the pixel driving circuits.

S803 is to form a resistance reducing electrode arranged at a different layer from the signal lines, where the resistance reducing electrode is coupled to the signal lines.

Particularly in the fabricating method according to the embodiment of the present disclosure, the pixel elements can be formed after the resistance reducing electrode is formed, or of course, one of electrodes of the pixel elements can be formed at the same time as the resistance reducing electrode.

Optionally in order to simplify the fabrication process, to lower the production cost, and to improve the production efficiency, in the fabricating method according to the embodiment of the present disclosure, forming the resistance reducing electrode arranged at a different layer from the signal lines particularly includes the following steps.

Forming a first electrode layer arranged at a different layer from the signal lines.

Forming first electrodes and the resistance reducing electrode at the first electrode layer in a patterning process. In this way, a patterning process of fabricating the resistance reducing electrode separately can be dispensed with, but the resistance reducing electrode can be formed at the same time as the first electrodes of the pixel elements.

It shall be noted that in the fabricating method above according to the embodiment of the present disclosure, the respective layers are structurally formed in patterning processes which can not only include a part or all of processes of vapor plating, deposition, coating photoresist, masking using a mask, exposure, development, etching, and stripping photoresist, but also include other processes, dependent upon the patterns thereof to be formed in their real fabrication processes, although the embodiment of the present disclosure will not be limited thereto. For example, a post-baking process can be further included after development, and before etching.

Here the deposition process can be chemical vapor deposition, plasma enhanced chemical vapor deposition, or physical vapor deposition, although the embodiment of the present disclosure will not be limited thereto; the mask for the masking process can be a half tone mask, a single slit mask, or a gray tone mask, although the embodiment of the present disclosure will not be limited thereto; and the etching process can be dry etching or wet etching, although the embodiment of the present disclosure will not be limited thereto.

Based upon the same inventive idea, an embodiment of the present disclosure further provides a display device including the organic light-emitting diode display panel above according to the embodiment of the present disclosure, and the display device can be a mobile phone, a tablet computer, a TV set, a monitor, a notebook computer, a digital camera, a navigator, an intelligent watch, an exercise wrist band, a personal digital assistant, or any other product or component with a display function. Reference can be made to the embodiment of the organic light-emitting diode display panel above for an implementation of the display device, and a repeated description thereof will be omitted here.

In the organic light-emitting diode display panel, the method for fabricating the same, and the display device above according to the embodiments of the present disclosure, the organic light-emitting diode display panel includes: an underlying substrate, a plurality of pixel elements arranged on the underlying substrate, pixel driving circuits electrically coupled to the respective pixel elements, and a plurality of signal lines electrically coupled to the pixel driving circuits; and the organic light-emitting diode display panel further includes a resistance reducing electrode arranged at a different layer from, and connected in parallel with at least one signal line. Since the resistance reducing electrode is connected in parallel with the signal lines, resistances of the respective signal lines can be reduced to thereby lower a signal load on the respective signal lines so as to improve the display quality of the organic light-emitting diode display panel.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. An organic light-emitting diode display panel, comprising an underlying substrate, a plurality of pixel elements arranged on the underlying substrate, pixel driving circuits electrically coupled to respective pixel elements, and a plurality of signal lines electrically coupled to the pixel driving circuits, wherein the organic light-emitting diode display panel further comprises:
   a resistance reducing electrode arranged at a different layer from, and connected in parallel with at least one of the signal lines;
   wherein the resistance reducing electrode extends in a first direction, or the resistance reducing electrode extends in a second direction, wherein there is an angle between the first direction and the second direction.

2. The organic light-emitting diode display panel according to claim 1, wherein the signal line extends in a first direction, and the signal line is configured to transmit a voltage-constant signal.

3. The organic light-emitting diode display panel according to claim 1, wherein the resistance reducing electrode is structured like a grid.

4. The organic light-emitting diode display panel according to claim 1, wherein the resistance reducing electrode is electrically coupled to respective signal lines through a plurality of via holes.

5. The organic light-emitting diode display panel according to claim 1, wherein there is an overlapping area between a positive projection of the resistance reducing electrode onto the underlying substrate and a positive projection of a pixel definition layer onto the underlying substrate.

6. The organic light-emitting diode display panel according to claim 5, wherein the positive projection of the resistance reducing electrode onto the underlying substrate does not overlap with positive projections of gaps between respective pixel elements onto the underlying substrate.

7. The organic light-emitting diode display panel according to claim 6, wherein each pixel element comprises a first electrode, a second electrode, and a light-emitting layer located between the first electrode and the second electrode; and
   the resistance reducing electrode is arranged at the same layer as the first electrode, or the resistance reducing electrode is arranged at the same layer as the second electrode.

8. The organic light-emitting diode display panel according to claim 5, wherein the resistance reducing electrode is arranged at a different layer from the pixel elements.

9. The organic light-emitting diode display panel according to claim 8, wherein the organic light-emitting diode display panel further comprises an insulation layer arranged between the resistance reducing electrode and the pixel elements.

10. The organic light-emitting diode display panel according to claim 9, wherein the resistance reducing electrode is located between the pixel elements and the pixel driving circuits.

11. A display device, comprising the organic light-emitting diode display panel according to claim 1.

12. A method for fabricating an organic light-emitting diode display panel, the method comprising:
    providing an underlying substrate;
    forming pixel driving circuits on the underlying substrate, and a plurality of signal lines coupled to the pixel driving circuits; and
    forming a resistance reducing electrode arranged at a different layer from the signal lines, wherein the resistance reducing electrode is connected in parallel with at least one of the signal lines, and extends in a first direction or a second direction, wherein there is an angle between the first direction and the second direction.

13. The fabricating method according to claim 12, wherein forming the resistance reducing electrode arranged at a different layer from the signal lines comprises:
    forming a first electrode layer arranged at a different layer from the signal lines; and
    forming first electrodes and the resistance reducing electrode at the first electrode layer in a patterning process.

14. An organic light-emitting diode display panel, comprising an underlying substrate, a plurality of pixel elements arranged on the underlying substrate, pixel driving circuits electrically coupled to respective pixel elements, and a plurality of signal lines electrically coupled to the pixel driving circuits, wherein the organic light-emitting diode display panel further comprises:
    a resistance reducing electrode arranged at a different layer from, and connected in parallel with at least one of the signal lines;
    wherein there is an overlapping area between a positive projection of the resistance reducing electrode onto the underlying substrate and a positive projection of a pixel definition layer onto the underlying substrate.

15. A display device, comprising the organic light-emitting diode display panel according to claim 14.

* * * * *